(12) United States Patent
Wang et al.

(10) Patent No.: US 9,893,070 B2
(45) Date of Patent: Feb. 13, 2018

(54) SEMICONDUCTOR DEVICE AND FABRICATION METHOD THEREFOR

(71) Applicant: TAIWAN SEMICONDUCTOR MANUFACTURING COMPANY, LTD., Hsinchu (TW)

(72) Inventors: Chin-Shan Wang, Hsinchu (TW); Shun-Yi Lee, Zhudong Township (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 15/178,903

(22) Filed: Jun. 10, 2016

(65) Prior Publication Data
US 2017/0358584 A1 Dec. 14, 2017

(51) Int. Cl.
H01L 23/48 (2006.01)
H01L 27/108 (2006.01)

(52) U.S. Cl.
CPC .... H01L 27/10832 (2013.01); H01L 27/1087 (2013.01); H01L 27/10826 (2013.01); H01L 27/10879 (2013.01); H01L 27/10891 (2013.01)

(58) Field of Classification Search
CPC ......... H01L 27/10832; H01L 27/10826; H01L 27/1087; H01L 27/10879; H01L 27/10891
See application file for complete search history.

(56) References Cited

U.S. PATENT DOCUMENTS

| 8,492,213 B2 * | 7/2013 | Mieno | H01L 29/045 257/190 |
| 8,943,455 B2 | 1/2015 | Chen et al. | |
| 9,123,565 B2 | 9/2015 | Lu et al. | |
| 9,158,877 B2 | 10/2015 | Hsieh et al. | |
| 2003/0141550 A1 * | 7/2003 | Nandakumar | H01L 29/6659 257/368 |
| 2009/0101956 A1 * | 4/2009 | Booth, Jr. | H01L 27/1087 257/301 |
| 2010/0006932 A1 * | 1/2010 | Matsubara | H01L 21/823456 257/334 |
| 2010/0252812 A1 * | 10/2010 | Raychowdhury | B82Y 10/00 257/24 |
| 2013/0134483 A1 * | 5/2013 | Adkisson | H01L 29/66234 257/197 |
| 2013/0140639 A1 * | 6/2013 | Shieh | H01L 21/823412 257/368 |
| 2013/0285141 A1 * | 10/2013 | Kuo | H01L 29/66545 257/347 |
| 2016/0049494 A1 * | 2/2016 | Zschatzsch | H01L 29/66545 257/288 |
| 2016/0149023 A1 * | 5/2016 | Mears | H01L 29/7782 257/20 |

* cited by examiner

Primary Examiner — Nicholas Tobergte
(74) Attorney, Agent, or Firm — Hauptman Ham, LLP

(57) ABSTRACT

A method of fabricating a semiconductor device. The method includes forming a dummy structure over a substrate, forming conductive features on opposite sides of the dummy gate structure, removing the dummy structure and a portion of the substrate beneath the dummy gate structure to form a trench, and filling the trench with a dielectric material.

20 Claims, 7 Drawing Sheets

SEMICONDUCTOR DEVICE AND FABRICATION METHOD THEREFOR

BACKGROUND

Capacitors are components for many data manipulation and storage applications. In general, a capacitor includes two conductive electrodes separated by an insulator. Various capacitors are used for a myriad of purposes in modern integrated circuits (ICs). For example, in a vertically-oriented capacitor such as a metal-insulator-metal (MIM) capacitor, a dielectric material is sandwiched between two metal layers or between a polysilicon layer and a metal layer. As design rules shrink; however, capacitance values decrease because dimensions of the metal layer or the polysilicon layer decreases. The capacitance of a capacitor depends on a thickness of the dielectric material. A thin dielectric material results in the capacitor having a high capacitance.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of various features in the drawings may be arbitrarily increased or reduced for clarity of discussion.

DETAILED DESCRIPTION

Figure 1:
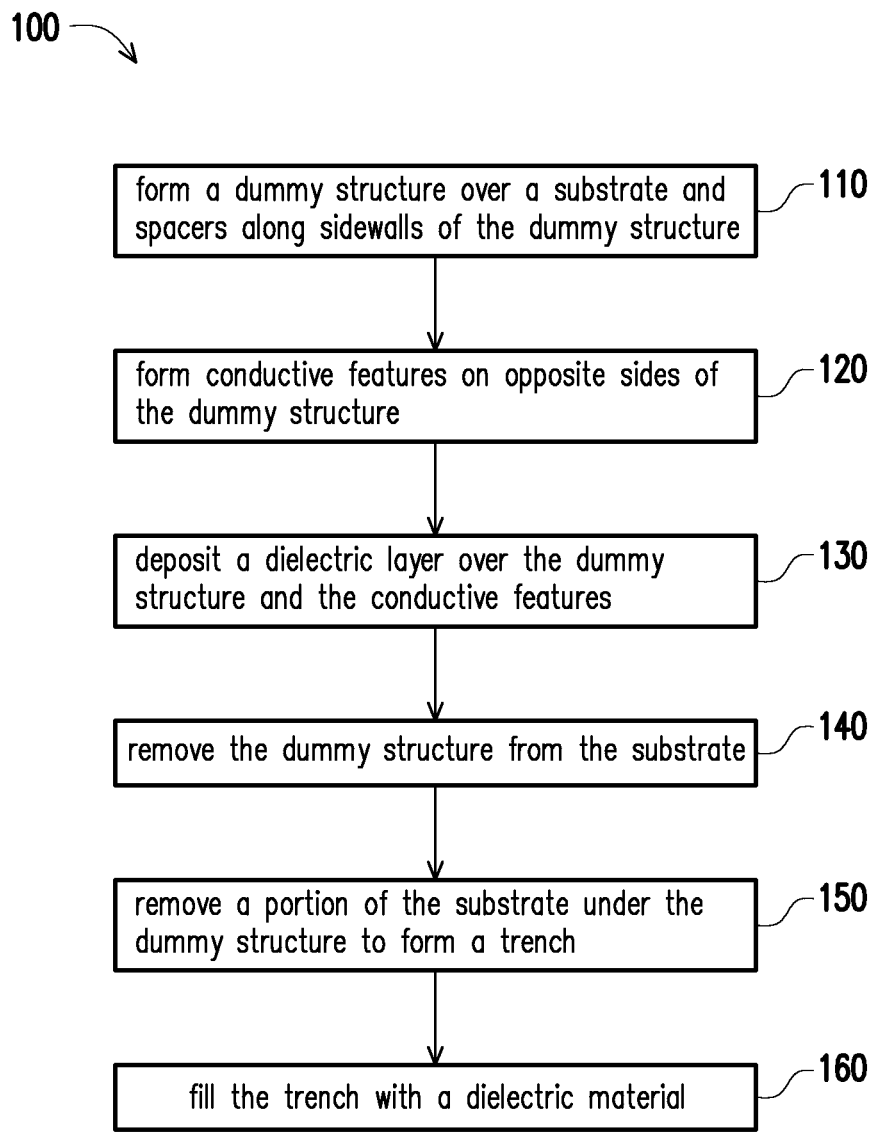
FIG. 1 is a flowchart of a method of fabricating a semiconductor device including a capacitor in accordance with one or more embodiments.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Various features may be arbitrarily drawn in different scales for simplicity and clarity. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A capacitance of a capacitor depends upon a structure of the capacitor. In some approaches for forming capacitors, uneven insulating layers result in excessive capacitance variation for different capacitors in integrated circuit (IC) chips. In order to obtain better capacitance uniformity, a thickness of the insulating layer is increased thereby causing a small capacitance for the resulting capacitor. A horizontally-oriented capacitor is able to improve capacitance uniformity while maintaining a thin insulating layer relative to a vertically-oriented capacitor. The relatively thin insulating layer helps to maintain a small size of the IC chips. A continuous poly on oxide definition edge (CPODE) pattern is used to form a trench by removing a dummy structure and a portion of a substrate under the dummy structure. In at least one example, the term "oxide definition" is an active region for a transistor, i.e., the area where a source, a drain, and a channel under a gate of the transistor are formed. In some examples, the oxide definition region is between insulating regions. The trench is filled with a dielectric material usable to form a horizontally-oriented capacitor. Conductive features of the capacitor are a source/drain electrode of a first transistor and a source/drain electrode of an adjacent transistor. The horizontally-oriented capacitor occupies a reduced area in the IC chip while maintaining a uniform capacitance in comparison with other approaches.

In some embodiments, the insulating regions are called inactive regions or isolation regions. In some embodiments, the insulating regions are shallow trench isolation (STI), field oxide (FOX) areas, or other suitable electrically insulating structures. In some embodiments, the capacitor is aligned with a middle line between two abutted active regions or two abutted standard cells in the substrate. The two abutted active regions or two abutted standard cells are separated by the insulating layer of the capacitor. In at least one embodiment, the capacitor is coupled to two transistors. In some embodiments, a plurality of capacitors is between adjacent transistors. In some embodiments, the transistor is a fin field effect transistor (FinFET). In some embodiments, the transistor is a planar field effect transistor. The capacitor and the transistor are included in a complimentary metal-oxide-semiconductor (CMOS) IC, a memory cell or other similar structure in some embodiments.

FIG. 1 is a flowchart of a method 100 of fabricating a semiconductor device including a capacitor in accordance with one or more embodiments. Method 100 includes operation 110 in which a dummy structure is formed over a substrate and spacers are formed along sidewalls of the dummy structure. The dummy structure is on a top surface of the substrate. In at least one embodiment, a semiconductor strip is formed above the substrate and the dummy structure is on a top surface of the semiconductor strip. In some embodiments, the dummy structure is formed on an edge of a cell. The dummy structure is called a sacrificial gate structure, in some instances.

The spacers are on the top surface of the substrate. The spacers adjoin sidewalls of the dummy structure. In some embodiments, the spacers include silicon oxide, silicon nitride, or another suitable material. For example, the spacers include an oxide-nitride-oxide (ONO) structure in some embodiments.

FIGS. 2A to 2H are schematic cross-section views of the semiconductor device at various stages of fabrication according to the flowchart of FIG. 1 in accordance with one or more embodiments.

Figure 2A:
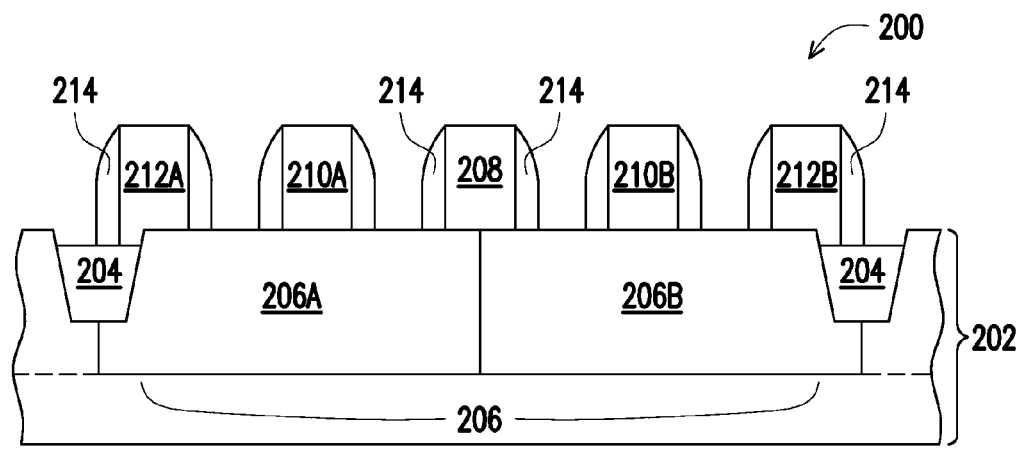
FIGS. 2A-2H are cross-sectional views of a semiconductor device having a capacitor at various stages of fabrication in accordance with one or more embodiments.

FIG. 2A is a cross-sectional view of a semiconductor device 200 following operation 110 in accordance with one or more embodiments. Semiconductor device 200 includes a substrate 202. In at least one embodiment, substrate 202 is a silicon substrate. In some embodiments, substrate 202 is a silicon on insulating layer (SOI) substrate, or a silicon on sapphire (SOS) substrate. Substrate 202 includes a suitable elemental semiconductor, such as germanium or diamond; a suitable compound semiconductor, such as silicon carbide, gallium nitride, gallium arsenide, or indium phosphide; or a suitable alloy semiconductor, such as silicon germanium, silicon tin, aluminum gallium arsenide, or gallium arsenide phosphide.

Insulating regions 204 are located in substrate 202. Active region 206 is between insulating regions 204. Active region 206 includes a first well region 206A and a second well region 206B. In some embodiments, active region 206 includes a single well region. Dummy gate structures 208, 210A, 212A, 210B and 212B are on a top surface of substrate 202. In a subsequent procedure, dummy gate structures 210A and 210B are replaced with functioning gate structures. Dummy gate structures 212A and 212B either remain non-functioning gate structures or are replaced with different non-functioning gate structures. Dummy gate structures 208, 210A, 212A, 210B and 212B are at least partially on active region 206. Dummy gate structures 208, 210A and 210B are completely on active region 206. Dummy gate structures 212A and 212B are partially on active region 206 and partially on insulating regions 204. In some embodiments, dummy gate structures 212A and 212B are completely on active region 206. Dummy gate structure 210A is on first well region 206A and dummy gate structure 210B is on second well region 206B. Gate spacers 214 are along sidewalls of each of dummy gate structures 208, 210A, 212A, 210B and 212B.

Insulating regions 204, for example, STI or FOX insulating regions, surround active region 206. A top surface of active region 206 is above a top surface of insulating regions 204. In some embodiments, the top surface of active region 206 is substantially coplanar with the top surface of insulating regions 204. In some embodiments, active region 206 is a semiconductor strip between insulating regions 204. Active region 206 includes first well region 206A and second well region 206B disposed in substrate 202 and adjacent to insulating regions 204. The formation of the active region 206 (also referred to as a well region) includes an implantation process in some embodiments. Insulating regions 204 electrically isolate first well region 206A and second well region 206B from other areas of substrate 202. In at least one example, the formation of insulating regions 204 includes a photolithography process, an etch process to form trenches in substrate 202, and a deposition process to fill the trenches with one or more dielectric materials. In some embodiments, the formation of insulating regions 204 includes another STI procedure or local oxidation of silicon (LOCOS).

Dummy gate structures 208, 210A, 212A, 210B and 212B are on substrate 202. In some embodiments, semiconductor device 200 includes dummy structures other than dummy gate structures, such as a dummy structure completely on insulating region 204. Dummy gate structure 208 is between dummy gate structures 210A and dummy gate structures 210B. In some embodiments, in a first transistor, dummy gate structure 210A is replaceable to form a gate electrode, e.g., in a gate last process; and dummy gate structure 212A and dummy gate structure 208 are subsequently usable to form edge gate structures. In the given embodiment, in a second transistor, dummy gate structure 210B is replaceable to form a gate electrode and dummy gate structure 212B and dummy gate structure 208 are subsequently usable to form edge gate structures.

In some embodiments, dummy gate structure 212A, dummy gate structure 212B, and dummy gate structure 208 do not function as a gate terminal of active transistors, but are used to protect an edge of an active transistor. In at least one example, dummy gate structure 208 is a common edge gate structure of the first transistor and the second transistor. In some embodiments, because dummy gate structure 208 is formed on an edge of an oxide definition (OD) region or an edge of a cell, dummy gate structure 208 corresponds to a CPODE pattern. For example, dummy gate structure 208 is on two abutted OD regions and aligned with a middle line (i.e., the common edge) of the two abutted OD regions. With respect to FIG. 2A, the two abutted OD regions are first well region 206A and second well region 206B. In some embodiments, dummy gate structure 208 is offset from the middle line of two abutted OD regions. In some embodiments, in an IC layout, the CPODE pattern is schematically illustrated in drawings with the label "CPODE." In some embodiments, one or more CPODE patterns are formed of a same material, by using a same photomask, such as poly (polysilicon) patterns. In such embodiments, the poly patterns and the CPODE patterns are formed in a same layer. In some embodiments, CPODE patterns are merged with one or more transistors in a standard cell layout to achieve a higher density and smaller corner variations such as mobility variations caused by process variations for cells placed at different locations on a same chip or for chips placed at different locations on a same wafer. Corner variations are the result of non-uniformities in a manufacturing process which result in devices having variations in performance characteristics.

Dummy gate structure 208 is between a source/drain feature of the first transistor and a source/drain feature of the second transistor. Therefore, a capacitor is formable using dummy gate structure 208 and the conductive source/drain features of the first and second transistors.

In some embodiments, dummy gate structures 208, 210A, 212A, 210B and 212B are formed simultaneously. In a "gate last" or "replacement gate" methodology, dummy gate structures 208, 210A, 212A, 210B and 212B, also called sacrificial gate structures, are initially formed, various processes associated with semiconductor device 200 are performed, and dummy gate structures 208, 210A, 212A, 210B and 212B are subsequently removed and replaced with one or more materials. In some embodiments, dummy gate structures 208, 210A, 212A, 210B and 212B include a gate dielectric and/or a gate electrode.

For example, the gate dielectric is silicon dioxide. The silicon dioxide is a thermally grown oxide in some embodiments. In some embodiments, the gate dielectric is a high dielectric constant (high-k) dielectric material. A high-k dielectric material has a dielectric constant higher than that of silicon dioxide. In some embodiments, the gate electrode includes polycrystalline-silicon (poly-Si), poly-crystalline silicon-germanium (poly-SiGe), metallic nitride, metallic silicide, metallic oxide, metal, and/or other suitable layers. The formation of the gate electrode includes a deposition process and a subsequent etch process in some embodiments. In some embodiments, dummy gate structures 208, 210A, 212A, 210B and 212B further include a hard mask layer on the gate electrode. In some embodiments, dummy gate structures 208, 210A, 212A, 210B and 212B are formed in a "gate first" methodology or a hybrid process of "gate last" and "gate first" methodologies.

Gate spacers 214 are along sidewalls of dummy gate structures 208, 210A, 212A, 210B and 212B. Gate spacers 214 include a dielectric material such as silicon oxide, silicon nitride, silicon oxynitride, silicon carbide, or combinations thereof. The formation of gate spacers 214 includes a procedure including deposition and etch back processes in some embodiments. In various embodiments, gate spacers 214 are patterned by performing an isotropic or an anisotropic etch process.

Returning to FIG. 1, method 100 continues with operation 120 in which conductive features are formed on opposite sides of the dummy gate structure. Portions of the substrate are removed to form recesses adjacent to the gate spacers. In some embodiments, portions of the semiconductor strip are removed to form the recesses and the recesses are over the substrate. In some embodiments, the recesses extend through the semiconductor strip into the substrate. In some embodiments, the recesses are entirely within the semiconductor strip. The semiconductor strip is called a fin, in some instances. A filling process is then performed by filling the recesses with one or more semiconductor materials. The formation of the recesses includes an etch process such as a wet etching or a dry etching. In some embodiments, the etch process is performed to remove a top surface portion of the active region adjacent to the dummy gate structure and/or the isolation region. In some embodiments, the filling process is performed by an epitaxial (epi) process. In some embodiments, the conductive features are formed using an implantation process. In some embodiments, the conductive features include lightly doped drain (LDD) regions.

Figure 2B:
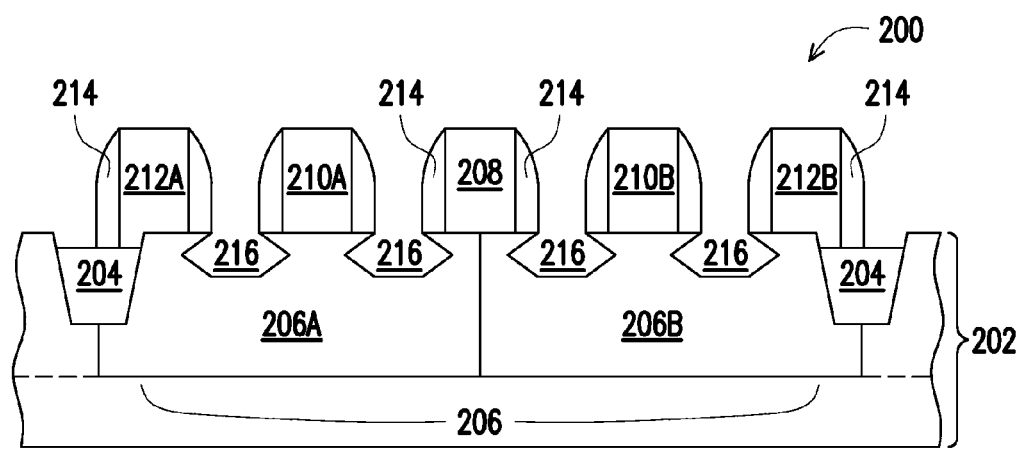

FIG. 2B is a cross-sectional view of semiconductor device 200 during operation 120 in accordance with one or more embodiments. Recesses 216 are in substrate 202 between gate spacers 214 of adjacent dummy gate structures 208, 210A, 212A, 210B and 212B. In some embodiments, recesses 216 are in substrate 202 between gate spacer 214 and insulating region 204. Recesses 216 have a substantially triangle, trapezoid, pentagon, or hexagon shape depending on parameters of the etch process used to form recesses 216 and/or a crystal structure of the substrate 202. Portions of substrate 202 are removed by an isotropic or an anisotropic etch process. The etch process selectively etches substrate 202 without etching dummy gate structures 208, 210A, 212A, 210B, 212B and gate spacers 214. In at least one example, a portion of recess 216 extends a distance under gate spacer 214 or a distance under gate structures 208, 210A, 212A, 210B and 212B. In some embodiments, the etch process is performed using a reactive ion etching (RIE), a wet etching, or other suitable techniques.

Figure 2C:
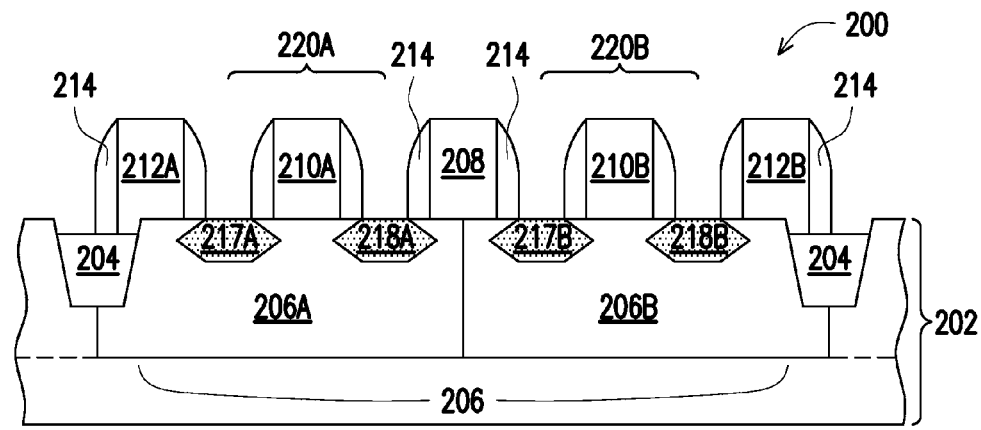

FIG. 2C is a cross-sectional view of semiconductor device 200 following operation 120 in accordance with one or more embodiments. Conductive features 217A, 218A, 217B, and 218B are in recesses 216. In some embodiments, an epi process is performed to form conductive features 217A, 218A, 217B, and 218B. The epi process includes a selective epitaxy growth (SEG), a chemical vapor deposition (CVD) techniques (e.g., vapor-phase epitaxy (VPE) and/or ultra-high vacuum CVD (UHV-CVD)), molecular beam epitaxy (MBE), other suitable processes, or combinations thereof. In some embodiments, the epi process uses gaseous and/or liquid precursors, which interacts with a composition of substrate 202. In some embodiments, for example, if the first transistor is an n-type transistor and the second transistor is a p-type transistor, the epi process is performed separately for the first transistor and the second transistor; or the epi process is performed merely for the first transistor or the second transistor. In some embodiments, conductive features 217A, 218A, 217B, and 218B are in-situ doped or undoped during the epi process. When undoped during the epi process, conductive features 217A, 218A, 217B, and 218B are doped during a subsequent process, in some instances. The doping process is performed by an ion implantation process, plasma immersion ion implantation (PIII) process, gas and/or solid source diffusion process, other suitable process, or combinations thereof. In some embodiments, conductive features 217A, 218A, 217B, and 218B are further exposed to an annealing process, such as a rapid thermal annealing process, to diffuse dopants in conductive features 217A, 218A, 217B and 218B. One or more gate spacers, such as an additional gate spacer that covers gate spacers 212, are formed before or after the formation of conductive features 217A, 218A, 217B, and 218B, in some instances. In some embodiments, the additional gate spacers include second spacers along sidewalls of gate spacers 212. For example, the second spacers are formed by depositing a dielectric layer such as silicon nitride, silicon oxide, or silicon oxynitride and subsequently removed by an anisotropic etch process to form a D-shape or a spacer shape.

In at least one embodiment, dummy gate structure 210A is a gate terminal of a first transistor 220A; and conductive features 217A and 218A are source/drain terminals of the first transistor 220A. Dummy gate structure 210B is a gate terminal of a second transistor 220B; and conductive features 217B and 218B are source/drain terminals of the second transistor 220B. Conductive features 217A, 218A, 217B, and 218B extend above the top surface of substrate 202 and are referred to as raised source and drain regions, in some instances. A pair of adjacent conductive features is able to function as two conductive components in a capacitor. For example, conductive features 218A and 217B with an insulator therebetween form a capacitor.

Returning again to FIG. 1, method 100 continues with operation 130 in which a dielectric layer is deposited over the dummy gate structure and the conductive features. In some embodiments, an etch stop layer such as a contact etch stop layer (CESL) is deposited on the dummy gate structures and the conductive features prior to depositing the dielectric layer. The etch stop layer includes silicon oxide, silicon nitride, silicon oxynitride, silicon carbide, silicon oxycarbide, or other suitable material. In some embodiments, the formation of the etch stop layer includes a deposition process and then an etch back process. The etch stop layer is deposited by CVD, high density plasma CVD (HDP-CVD), spin-on coating, physical vapor deposition (PVD), atomic layer deposition (ALD), and/or other suitable method. Afterward, for example, a dielectric layer is deposited by CVD, PVD, high density plasma (HDP), spin-on-dielectric process, other suitable processes, and/or combination thereof. In some embodiments, the deposition process is followed by a planarization process, such as a chemical mechanical polishing (CMP) process, an etch process, or another suitable process.

Figure 2D:
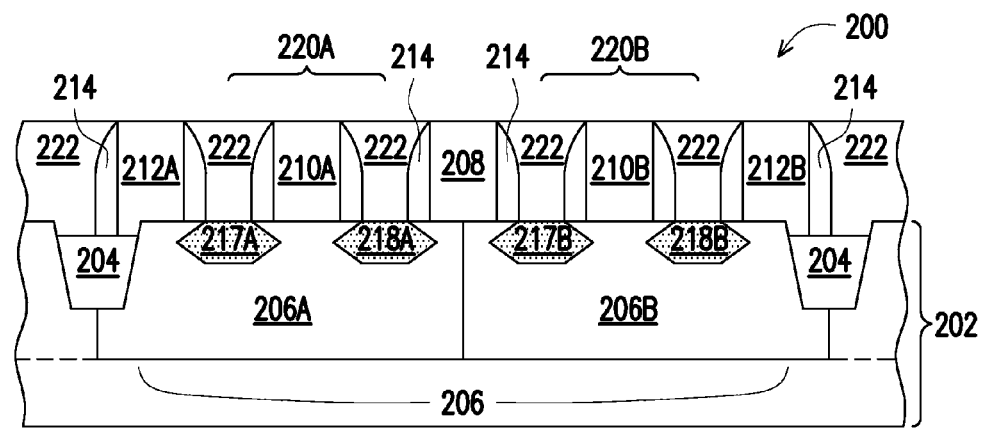

FIG. 2D is a cross-sectional view of semiconductor device 200 following operation 130 in accordance with one or more embodiments. After an etch stop layer (not shown) is formed over dummy gate structures 208, 210A, 212A, 210B and 212B, gate spacers 214, and conductive features 217A, 218A, 217B and 218B, an inter-layer dielectric (ILD) 222 is deposited over the etch stop layer. In some embodiments, ILD 222 includes an insulating material such as silicon oxide, silicon nitride, undoped silicate glass (USG), Boro-Silicate Glass (BSG), a low-k material, TEOS, other suitable materials, and/or combination thereof. In some embodiments, ILD 222 is planarized to be coplanar with a top surface of dummy gate structures 208, 210A, 212A, 210B and 212B. For example, ILD 222 is planarized by using a chemical mechanical planarization (CMP) to remove portions of ILD 222 over dummy gate structures 208, 212A and 212B as well as dummy gate structures 210A and 210B. In some embodiments, the CMP is applied to remove the etch stop layer on the dummy gate structures 208, 210A, 212A, 210B and 212B to expose the gate electrode. In some embodiments, the CMP is applied to further remove the hard mask layer on the gate electrode. In various embodiments, other planarization techniques are used, such as an etch process.

Returning again to FIG. 1, method 100 continues with operation 140 in which the dummy gate structure is removed from the substrate. In some embodiments, the dummy gate structure is the common dummy gate between the first active region and the second active region. The dummy gate structure is removed using a photolithography process and an etch process. During the photolithography process, the dummy gate structure corresponding to the CPODE pattern is exposed while the other gate structures or dummy gate structures are covered by a mask layer. The etch process is performed to remove the gate dielectric and gate electrode to expose the top surface of the substrate. In some embodiments, removing the dummy gate structure comprises replacing dummy gate structures other than the CPODE pattern dummy gate structure with gate electrodes in a "gate last" process.

Figure 2E:
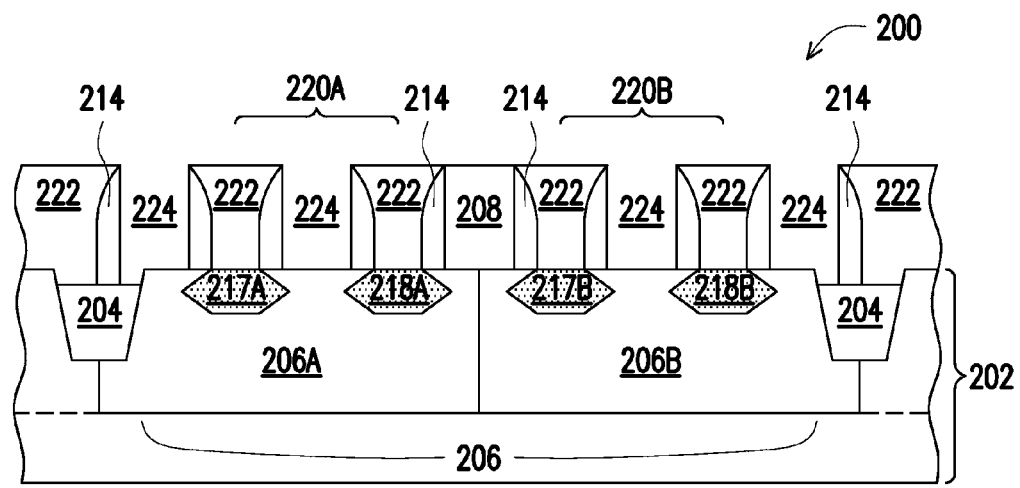

FIG. 2E is a cross-sectional view of semiconductor device 200 during operation 140 in accordance with one or more embodiments. FIG. 2E is a cross-sectional view during a "gate last" process in which dummy gate structures 210A, 212A, 210B and 212B are removed to be replaced by gate electrodes. The gate electrode and gate dielectric are removed from dummy gate structures 210A, 212A, 210B, and 212B, resulting in openings 224 in ILD 222. Openings 224 are between gate spacers 214. Removal of the gate electrode and gate dielectrics from dummy gate structures 210A, 212A, 210B, and 212B includes a photolithography process and an etch process. The etch process includes a wet etching by using a solution such as $NH_4OH$, dilute HF, and/or other suitable etchant, or a dry etching by using a gas such as fluorine-based and/or chlorine-based etchants. In some embodiments, the gate dielectric remains on the top surface of substrate 202 and only the gate electrode is removed. For example, the gate dielectric is a high-k dielectric material such as $HfO_2$, $TiO_2$, $HfZrO$, $Ta_2O_3$, $HfSiO_4$, $ZrO_2$, $ZrSiO_2$, and/or other suitable materials. In at least one embodiment, the gate dielectric is subsequently removed from substrate 202 by using a buffered oxide etchant (BOE) after the removal of the gate electrode. A gate replacement process is then performed. In some embodiments, openings 224 are filled with one or more layers. For example, a first dielectric layer is formed on the top surface of substrate 202 by using a thermal oxidation process. The first dielectric layer is formed by a deposition process, in some instances. In some embodiments, a second dielectric layer is formed on the first dielectric layer. The second dielectric layer includes a high-k dielectric material, in some instances. In some embodiments, the second dielectric layer has a U-shape or a rectangular shape. In some embodiments, a conductive layer is located within a cavity defined by the second dielectric layer. The conductive layer is disposed directly on the first dielectric layer, in some instances. In at least one embodiment, the conductive layer is tungsten. In some embodiments, the conductive layer includes different materials such as titanium, nickel, or tantalum, and has a work function suitable for a p-type device or an n-type device. In first transistor 220A, a gate electrode and an edge gate structure are formed after the gate replacement process. In second transistor 220B, a gate structure and a dummy gate structure are formed after the gate replacement process.

Returning again to FIG. 1, method 100 continues with operation 150 in which a portion of the substrate under the dummy structure is removed to form a trench. The dummy gate structure and the portion of the substrate underneath are removed using one or multiple etch processes. In some embodiments, a removal process used to remove the dummy structure in operation 140 and a removal process used to remove a portion of the substrate in operation 150 is a continuous removal process. In some embodiments, the removal process used to remove the dummy structure in operation 140 and the removal process used to remove the portion of the substrate in operation 150 are separate removal processes. In at least one embodiment, the trench corresponds to the CPODE pattern. In some embodiments, the trench separates the two abutted active regions. In some embodiments, the trench is between two abutted standard cells. The trench extends through at least the abutted two well regions of the two abutted active regions, i.e., a bottom surface of the trench is below a bottom surface of the abutted two well regions. The formation of the trench includes an etch process. During the etch process, at least a portion of the substrate is removed to define a trench between the neighboring active regions. In some embodiments, such etch process is called over etching.

Figure 2F:
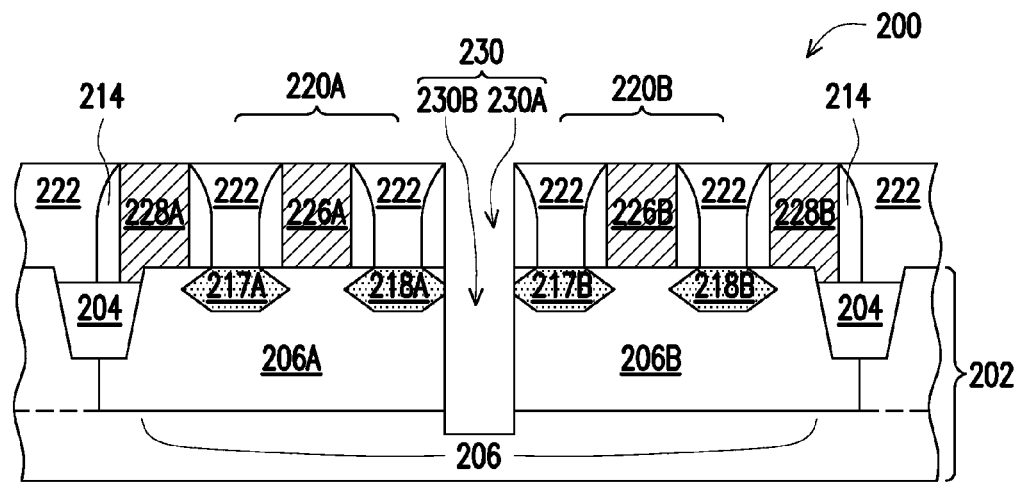

FIG. 2F is a cross-sectional view of semiconductor device 200 following operation 150 in accordance with one or more embodiments. A trench 230 includes an upper portion 230A and a lower portion 230B. Upper portion 230A is above the top surface of substrate 202 and lower portion 230B is below the top surface of substrate 202. Upper portion 230A is similar to openings 224 of gate structures 226A, 228A, 226B, and 228B. In some embodiments, upper portion 230A is formed simultaneously with the formation of openings 224. In some embodiments, upper portion 230A is formed sequentially with the formation of openings 224. Lower portion 230B is aligned with upper portion 230A. In some embodiments, upper portion 230A and lower portion 230B are formed by a single etch process. In some embodiments upper portion 230A and lower portion 230B are formed by multiple etch processes. For example, upper portion 230A is removed by the same procedure as openings 224 and lower portion 230B is removed by a subsequent dry etching with a plasma source and an etchant gas. The plasma source may be an inductively coupled plasma (ICP), a transformer coupled plasma (TCP), an electron cyclotron resonance (ECR), a RIE, and/or other suitable techniques. In at least one embodiment, trench 230 separates one active region into two active regions such as first well region 206A and second well region 206B. To reduce or prevent a leakage current between first transistor 220A and second transistor 220B, trench 230 extends to a depth equal to or greater than a depth of well regions. In some embodiments, adjacent conductive features 218A and 217B are at least partially exposed by trench 230. In some embodiments, an entire sidewall of conductive features 218A and 217B are exposed by trench 230. In some embodiments, portions of adjacent conductive features 218A and 217B are removed during the removal process to form lower portion 230B.

Returning again to FIG. 1, method 100 continues with operation 160 in which the trench is filled with a dielectric material. In some embodiments, the trench is filled with more than one dielectric materials. The dielectric material is usable as an insulating layer of a capacitor. The dielectric material has a width substantially equal to a gate length of the dummy structure and the other gate structures. The formation of the dielectric material includes a deposition process. In some embodiments, a planarization or etching process is used to remove excess material deposited during the formation of the dielectric material.

Figure 2G:
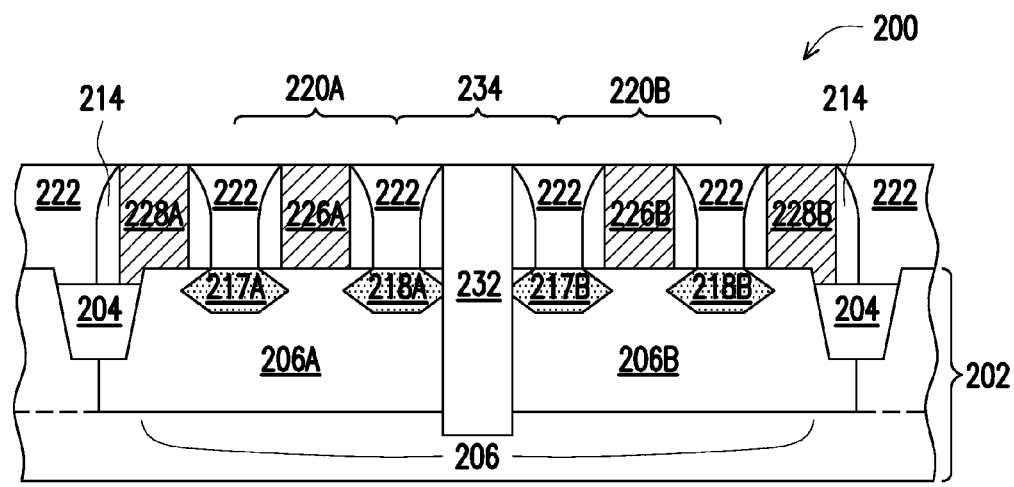

FIG. 2G is a cross-sectional view of semiconductor device 200 following operation 160 in accordance with one or more embodiments. Trench 230 is filled with dielectric material 232. In some embodiments, dielectric material 232 is silicon nitride, or silicon dioxide. In some embodiments, a top surface of dielectric material 232 is substantially co-planar with a top surface of gate structure 226A, 228A, 226B, or 228B. In some embodiments, a width of dielectric material 232 is substantially the same as the gate length of at least one of gate structure 226A, 228A, 226B, or 228B. The width of dielectric material 232 ranges from about 40 Angstroms (Å) to about 200 Å depending on a process node of semiconductor device 200. For example, the width of dielectric material 232 ranges from about 60 Å to about 100 Å, in some embodiments. If the width of dielectric material 232 is too thick, a capacitance of a capacitor 234 will be too small to increase functionality of semiconductor device 200, in some instances. If the width of dielectric material 232 is too thin, the dielectric material will not effectively insulate conductive feature 218A from conductive feature 217B, in some instances. Dielectric material 232 contacts conductive features 218A and 217B. In some embodiments, dielectric material 232 includes multiple structures. For example, dielectric material 232 includes an oxide-nitride-oxide structure (ONO). In some embodiments, upper portion 230A of trench 230 is filled with one dielectric material, and lower portion 230B of trench 230 is filled with one different dielectric material. Dielectric material 232 is formed by using a deposition process such as CVD, PVD, ALD, and/or other suitable processes, and/or combination thereof. In some embodiments, a first formation process is used to fill upper portion 230A and a different formation process is used to fill lower portion 230B. Dielectric material 232, conductive feature 218A, and conductive feature 217B form capacitor 234 wherein dielectric material 232 is an insulating layer between two conductive components 218A and 217B. In some embodiments, one or more capacitors are formed between conductive feature 218A and conductive feature 217B. In some embodiments, dummy gate structures 210A, 212A, 210B and 212B are able to be replaced after the formation of the dielectric material 232.

In comparison with other approaches which do not use a CPODE layer to form an insulating layer of a capacitor, capacitor 234 includes a greater capacitance with a thin and uniform dielectric material 232. Because dielectric material 232 occupies a small area, capacitor 234 is able to achieve a high capacitance per unit area. In additional, capacitor 234 is able to be coupled to a transistor in an IC layout arrangement without added considerations directed to the priority of capacitors and preserving additional areas to achieve sufficient capacitance. For example, capacitor 234 and transistors 220A and 220B are included in a layout unit configured to be a standard cell in a mask design. Moreover, in comparison with other approaches which do not use source/drain features as conductive components of a capacitor, capacitor 234 reduces a manufacturing cost because additional photomasks and manufacturing processes are avoided by forming capacitor 234 along with formation of transistors. For example, additional steps for manufacturing metal plates in areas such as interconnect structures are avoided. Meanwhile, because dielectric material 232 is in trench 230, a risk of misalignment is reduced or completely avoided during the fabrication of capacitor 234.

Figure 2H:
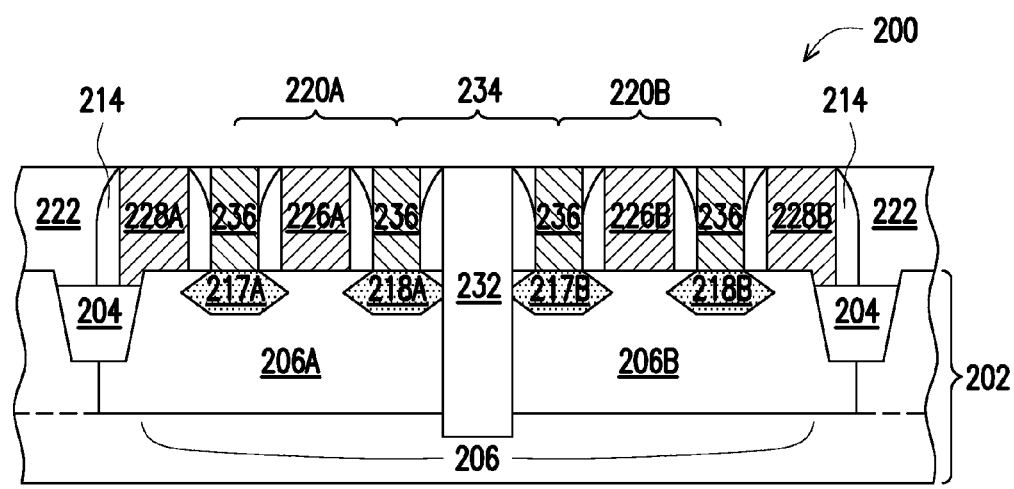

FIG. 2H is a cross-sectional view of semiconductor device 200 following operation 150 in accordance with one or more embodiments. Contact structures 234 are formed on conductive features 217A, 218A, 217B, and 218B. Semiconductor device 200 includes first transistor 220A, second transistor 220B, and capacitor 234. A plurality of contact openings (not shown) are formed in ILD 222 to expose conductive features 217A, 218A, 217B, and 218B. Contact structures 236 extend through ILD 222 and fill the contact openings. Contact structures 236 electrically connect to conductive features 217A, 218A, 217B, and 218B. For example, contact structure 236 electrically connects to a silicide formed on a top surface of conductive features. In some embodiments, contact structure 236 includes a contact plug and a liner. The contact plug is laterally surrounded by the liner. The liner is deposited in contact opening before the fabrication of the contact plug. In some embodiments, the liner is formed using CVD or other suitable processes, and/or combination thereof. One or more films are formed between the contact opening and contact structure 236, in some instances. In one or more embodiments, the liner is formed of titanium nitride, tungsten nitride, suitable nitride, or other materials. In some embodiments, contact structure 236 is coupled to another device or component of substrate 202.

Figure 3A:
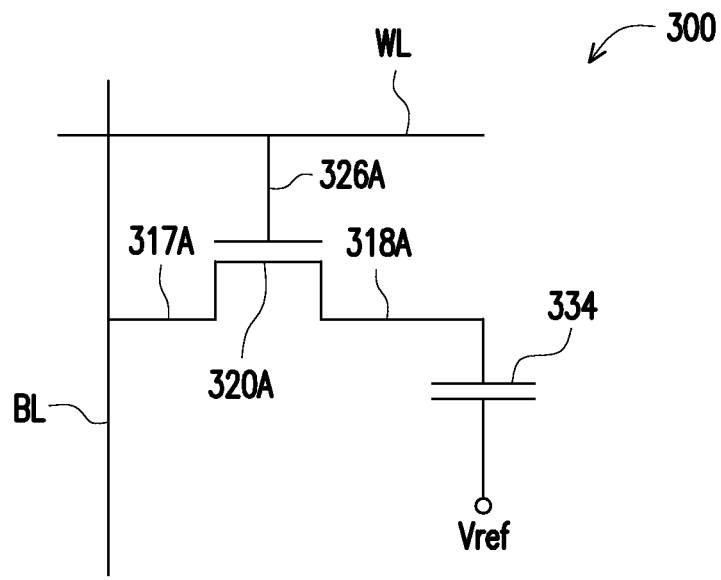
FIG. 3A is a schematic diagram of a semiconductor device in accordance with one or more embodiments.

FIG. 3A is a schematic diagram of a semiconductor device 300 in accordance with one or more embodiments. Semiconductor device 300 includes a transistor 320A, a capacitor 334, a word line WL, a bit line BL, and a reference voltage node Vref. In some embodiments, semiconductor device 300 is a memory cell. For example, such memory cell is called one transistor-one capacitor (1T1C) dynamic random access memory (DRAM), in some instances. A first transistor 320A includes a gate node, i.e., a gate structure 326A, source/drain nodes, i.e., conductive features 317A/318A, where conductive feature 318A is electrically coupled to capacitor 334.

Figure 3B:
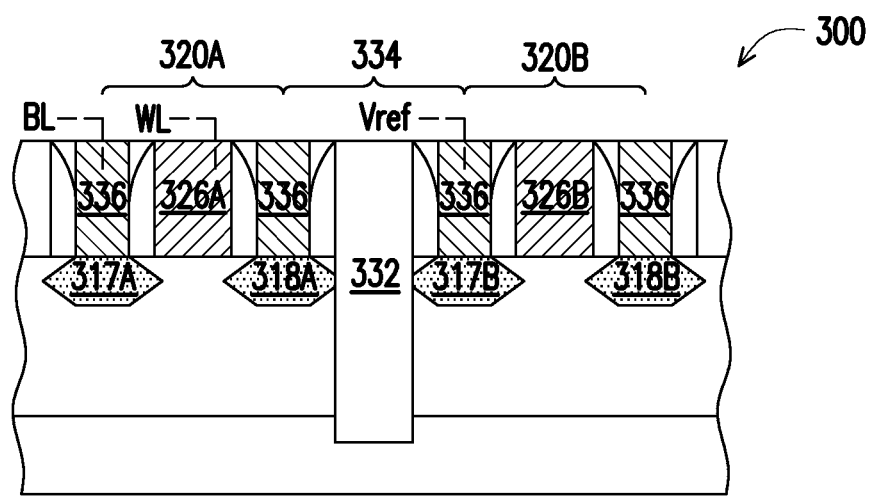
FIG. 3B is a cross-sectional view of the semiconductor device of FIG. 3A in accordance with one or more embodiments.

FIG. 3B is a cross-sectional view of semiconductor device 300. Capacitor 334 is electrically coupled to first transistor 320A and a second transistor 320B. Conductive feature 318A is a source electrode or a drain electrode of first transistor 320A, and is also a conductive component of capacitor 334. Conductive feature 317B is a source electrode or a drain electrode of second transistor 320B, and is also the other conductive component of capacitor 334.

In some embodiments, second transistor 320B is inactive so that first transistor 320A and capacitor 334 form a 1T1C memory cell. For example, in first transistor 320A, conductive feature 317A is coupled to bit line BL through a contact structure 336 and gate structure 326A is coupled to word line WL, where word line WL is called a control line because word line WL provides a control signal for accessing the memory cell. First transistor 320A is also called an access transistor in the memory cell. Conductive feature 318A acts as a node between first transistor 320A and capacitor 334. The other node of capacitor 334, i.e., conductive feature 317B, is coupled to reference voltage node Vref. In at least one embodiment, reference voltage node Vref is ground. In one or more embodiments, the couplings to word line WL, bit line BL, and reference voltage node Vref are completed in the subsequent metal wiring process.

Figure 4A:
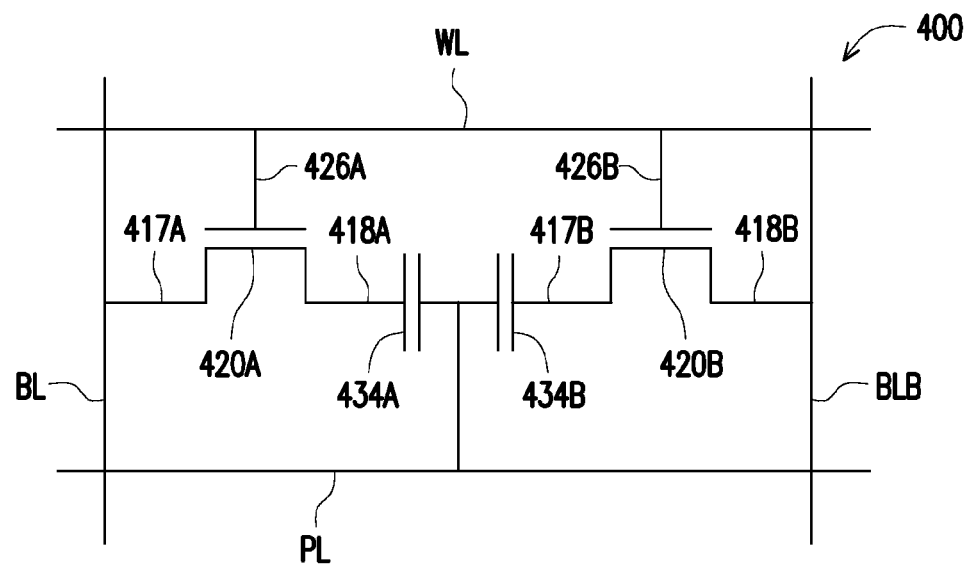
FIG. 4A is a schematic diagram of a semiconductor device in accordance with one or more embodiments.

FIG. 4A is a schematic diagram of a semiconductor device 400 in accordance with one or more embodiments. Semiconductor device 400 includes a first transistor 420A, a second transistor 420B, a first capacitor 434A, a second capacitor 434B, a word line WL, a bit line BL, a bit line bar BLB, and a plate line PL. In some embodiments, semiconductor device 400 is a memory cell. For example, such memory cell is called two transistor-two capacitor (2T2C) DRAM. A first transistor 420A includes a gate node, i.e., a gate structure 426A, source/drain nodes, i.e., conductive features 417A/418A, where conductive feature 418A is electrically coupled to first capacitor 434A. A second transistor 420B includes a gate node, i.e., a gate structure 426B, source/drain nodes, i.e., conductive features 417B/418B, where conductive feature 417B is electrically coupled to second capacitor 434B.

Figure 4B:
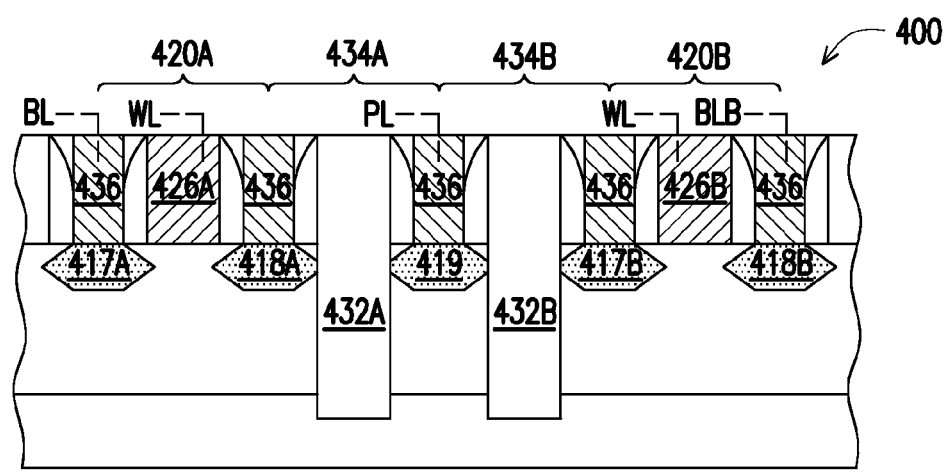
FIG. 4B is a cross-sectional view of the semiconductor device of FIG. 4A in accordance with one or more embodiments.

FIG. 4B is a cross-sectional view of semiconductor device 400, first capacitor 434A is electrically coupled to first transistor 420A and a common conductive feature 419. Conductive feature 418A is a source electrode or a drain electrode of first transistor 420A, and is also a conductive component of first capacitor 434A. Second capacitor 434B is electrically coupled to second transistor 420B and common conductive feature 419. Conductive feature 417B is a source electrode or a drain electrode of second transistor 420B and common conductive feature 419. In some embodiments, common conductive feature 419 is formed using the same procedure as conductive features 417A, 418A, 417B, and 418B. In some embodiments, more capacitors are able to be coupled in series between first transistor 420A and second transistor 420B.

In some embodiments, in first transistor 420A, conductive feature 417A is coupled to bit line BL through a contact structure 436 and gate structure 426A is coupled to word line WL where word line WL is called a control line. Conductive feature 418A is a node between first transistor 420A and first capacitor 434A. In some embodiments, in second transistor 420B, conductive feature 418B is coupled to bit line BLB through contact structure 436 and gate structure 426B is coupled to word line WL. Conductive feature 417B is a node between second transistor 420B and second capacitor 434B. Common conductive feature 419 is a common conductive component of first capacitor 434A and second capacitor 434B. In some embodiments, common conductive feature 419 is coupled to plate line PL. Plate line PL is called a reference voltage node or a ground voltage, in some instances. In one or more embodiments, the couplings to word line WL, bit line BL, bit line bar BLB, and plate line PL are completed in the subsequent metal wiring process. The couplings of the 2T2C memory structure are able to be modified to realize various forms of 2T2C memory structure depending on design requirements.

Semiconductor devices 200, 300, and 400 may undergo further processing to complete fabrication. For example, a not-illustrated multilayer interconnection (MLI) including metal layers (e.g., M1, M2, etc.) and inter-metal dielectric (IMD) are formed above gate structures 224A/226A/224B/226B, 326A/326B, and 426A/426B and conductive features 217A/218A/217B/218B, 317A/318A/317B/318B, and 417A/418A/417B/418B/419 in order to electrically couple various device parts to form an IC. The multilayer interconnection includes vertical interconnects, such as vias or contact structures, and horizontal interconnects, such as metal lines. In some embodiment, the various interconnection features utilize various conductive materials including copper, aluminum, tungsten, and silicide.

One aspect of this description relates to a method of fabricating a semiconductor device. The method includes forming a dummy structure over a substrate, forming conductive features on opposite sides of the dummy gate structure, removing the dummy structure and a portion of the substrate beneath the dummy gate structure to form a trench, and filling the trench with a dielectric material.

Another aspect of this description relates to a method of fabricating a capacitor. The method includes forming a dummy gate structure over a substrate, wherein the dummy gate structure is an edge gate structure between a source/drain electrode of a first transistor and a source/drain electrode of a second transistor, removing the dummy gate structure to define a first trench, removing a portion of the substrate exposed by the first trench to form a second trench aligned with the first trench, filling the first trench with a first dielectric material, and filling the second trench with a second dielectric material.

Still another aspect of this description relates to a semiconductor device. The semiconductor device includes a substrate, a first transistor on the substrate, wherein the first transistor comprises a first source/drain electrode, a second transistor on the substrate, wherein the second transistor comprises a second source/drain electrode, and an insulating layer extending into the substrate. The insulating layer directly contacts the first source/drain electrode and the second source/drain electrode, and the insulating layer is between the first source/drain electrode and the second source/drain electrode in a direction parallel to a top surface of the substrate.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods, operations, and steps described in the specification. As one of ordinary skill in the art will readily appreciate from the disclosure, processes, machines, manufacture, compositions of matter, means, methods, operations, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, operations, or steps. In addition, each claim constitutes a separate embodiment, and the combination of various claims and embodiments are within the scope of the disclosure.

What is claimed is:

1. A method of fabricating a semiconductor device, the method comprising:

forming a dummy structure over a substrate;

forming conductive features on opposite sides of the dummy structure;

removing the dummy structure and a portion of the substrate beneath the dummy structure to form a trench, wherein removing the portion of the substrate exposes a portion of the conductive features; and filling the trench with a dielectric material.

2. The method of claim 1, wherein the filling of the trench with a dielectric material comprises:

filling a first portion of the trench with a first dielectric material, and filling a second portion of the trench with a second dielectric material different from the first dielectric material.

3. The method of claim 1, further comprising planarizing the semiconductor device to expose a top surface of the dummy structure prior to the removing of the dummy structure.

4. The method of claim 1, wherein the dielectric material and the conductive features form a capacitor.

5. The method of claim 1, wherein removing the portion of the substrate comprises etching through an active layer to isolate a first well region and a second well region at opposite sides of the trench.

6. The method of claim 1, wherein removing the dummy structure and the portion of the substrate comprises defining the trench comprising an upper portion above a top surface of the substrate and a lower portion below the top surface of the substrate, and the upper portion is aligned with the lower portion.

7. The method of claim 1, wherein removing the dummy structure and the portion of the substrate comprises defining the trench having a width ranging from about 40 angstroms (Å) to about 200 Å.

8. A method of fabricating a semiconductor device, the method comprising:

forming a dummy gate structure over a substrate, wherein the dummy gate structure is an edge gate structure between a source/drain electrode of a first transistor and a source/drain electrode of a second transistor;

removing the dummy gate structure to define a first trench;

removing a portion of the substrate exposed by the first trench to form a second trench aligned with the first trench;

filling the first trench with a first dielectric material; and filling the second trench with a second dielectric material different from the first dielectric material.

9. The method of claim 8, wherein removing the portion of the substrate comprises removing the portion of the substrate and removing the dummy gate structure in a single etch process.

10. The method of claim 8, wherein filling the first trench with the first dielectric material comprises filling the first trench with silicon nitride.

11. The method of claim 8, further comprising:

connecting a gate of the first transistor to a word line; and connecting the source/drain electrode of the second transistor to a reference voltage.

12. The method of claim 11, further comprising connecting an additional source/drain electrode of the first transistor to a bit line, wherein the gate of the first transistor is between the additional source/drain electrode and the first dielectric material.

13. The method of claim 12, wherein removing the portion of the substrate comprises defining the second trench having a bottom surface lower than a bottom surface of a well in the substrate.

14. The method of claim 13, wherein filling the first trench with the first dielectric material comprises planarizing the first dielectric material to form a top surface of the first dielectric material co-planar with a top surface of the gate of the first transistor.

15. The method of claim 14, wherein removing the dummy gate structure comprises forming the first trench having a width ranging from about 60 angstroms (Å) to about 100 Å.

16. A method of manufacturing a semiconductor device, the method comprising:

forming a first sacrificial gate structure and a second sacrificial gate structure over a fin structure, wherein the first sacrificial gate structure is over a first well region, and the second sacrificial gate structure is over an interface between the first well region and a second well region;

depositing an insulating material over the first sacrificial gate structure and the second gate sacrificial structure;

removing the first sacrificial gate structure to form a first trench;

removing the second sacrificial gate structure to form a second trench;

filling the first trench with a conductive material; and filling the second trench with a dielectric material.

17. The method of claim 16, wherein the removing of the first sacrificial gate structure to form the first trench comprises:

removing the first sacrificial gate structure until the fin structure is exposed.

18. The method of claim 16, wherein the removing of the second sacrificial gate structure to form the second trench comprises:

removing the second sacrificial gate structure and a portion of the substrate beneath the second sacrificial gate structure, wherein a bottom surface of the second trench is below a bottom surface of the first well region.

19. The method of claim 16, wherein the removing of the second sacrificial gate structure to form a second trench comprises:

using a photomask corresponding to a continuous poly on oxide definition edge (CPODE) pattern to define the second sacrificial gate structure.

20. The method of claim 16, wherein the forming of the first sacrificial gate structure and the second sacrificial gate structure comprises:

forming the first sacrificial gate structure to have a same gate length as that of the second sacrificial gate structure.

* * * * *